(12) United States Patent
Ajika et al.

(10) Patent No.: US 8,964,463 B2
(45) Date of Patent: Feb. 24, 2015

(54) READ DISTURB CONTROL IN A NONVOLATILE SEMICONDUCTOR MEMORY DEVICE HAVING P-TYPE MEMORY CELL TRANSISTOR

(71) Applicant: Genusion, Inc., Hyogo (JP)

(72) Inventors: Natsuo Ajika, Hyogo (JP); Taku Ogura, Hyogo (JP); Masaaki Mihara, Hyogo (JP)

(73) Assignee: Genusion, Inc., Hyogo (JP)

( * ) Notice: Subject to any disclaimer, the term of this patent is extended or adjusted under 35 U.S.C. 154(b) by 114 days.

(21) Appl. No.: 13/855,902

(22) Filed: Apr. 3, 2013

(65) Prior Publication Data

US 2013/0265823 A1    Oct. 10, 2013

(30) Foreign Application Priority Data

Apr. 6, 2012 (JP) .................................. 2012-087597

(51) Int. Cl.
*G11C 16/34* (2006.01)
*G11C 11/56* (2006.01)

(52) U.S. Cl.
CPC ........ *G11C 16/3431* (2013.01); *G11C 11/5628* (2013.01); *G11C 11/5642* (2013.01)

USPC ............ 365/185.02; 365/185.03; 365/185.09; 365/185.21; 365/185.22; 365/185.24

(58) Field of Classification Search
USPC ............. 365/185.02, 185.03, 185.09, 185.21, 365/185.22, 185.2, 185.24
See application file for complete search history.

(56) References Cited

U.S. PATENT DOCUMENTS 5,400,286 A * 3/1995 Chu et al. ................. 365/185.19
6,026,018 A * 2/2000 Herdt et al. .............. 365/185.07

FOREIGN PATENT DOCUMENTS

JP          4113559 B2    4/2008

* cited by examiner

*Primary Examiner* — Andrew Q Tran
(74) *Attorney, Agent, or Firm* — The Marbury Law Group, PLLC

(57) ABSTRACT

A nonvolatile semiconductor memory device is provided which includes: a P-type memory cell transistor having a source, a drain, a gate, and a charge storage layer; and a control circuit which, in a case where the P-type memory cell transistor has its threshold greater than or equal to a first value (Vr) and less than or equal to a second value (Vrd), carries out a program operation of injecting electrons into the charge storage layer.

6 Claims, 15 Drawing Sheets

FIG. 2

|     | program | erase | read |
|-----|---------|-------|------|
| Vd  | 0V      | 10V   | 0.8V |
| Vcg | 10V     | -10V  | Vr   |
| Vs  | 1.8V    | 10V   | 1.8V |
| Vb  | 5V      | 10V   | 1.8V |

FIG. 6

| Vr | Vrd | Out |
|----|-----|-----|
| 0  | 0   | 1   |
| 0  | 1   | 0   |
| 1  | 0   | 1   |
| 1  | 1   | 1   |

331

READ DISTURB CONTROL IN A NONVOLATILE SEMICONDUCTOR MEMORY DEVICE HAVING P-TYPE MEMORY CELL TRANSISTOR

CROSS REFERENCE TO RELATED APPLICATION

This application is based upon and claims the benefit of priority from the prior Japanese Patent Application No. 2012-87597, filed on 6 Apr. 2012, the entire contents of which are incorporated herein by reference.

FIELD OF THE INVENTION

The present invention relates to nonvolatile semiconductor memory devices.

BACKGROUND OF THE INVENTION

Conventionally, NAND and NOR flash memories have been widely employed as nonvolatile semiconductor memory devices capable of electrical programming and erasing. In recent years, as tunnel oxide films has gotten thinner and thinner along with scaling of and increases in capacity of the memory cells of flash memories, there have been problems with shifts (read disturbs) in threshold due to the application of read voltages.

However, under actual use conditions, there might be applications where read operation is carried out during device operation; and since the frequency of reading is high especially in the code storage region in which the code of a program or the like is stored, restrictions on the number of times reading happens are unacceptable. Further, some memory controllers are mounted with a read disturb error self-restoring function (automatic recovery function). This function is fulfilled by placing a high-performance controller outside of a memory chip and saving and rewiring data on a block where read disturbs occurred and have been accumulated, and as such, requires an external buffer memory for use in data save and processing of ECC error correction information. No one unit chip has fulfilled such a function. Further, a technique for transferring data to another region cannot be adopted in a code storage memory, such as a NOR flash memory, in which addresses and data correspond to each other.

The applicant of the present invention proposes a B4-Flash memory using PMOS transistors as its memory cells unlike the conventional NAND and NOR flash (Patent Document 1). In the B4-Flash memory, the memory cells are PMOS, and therefore have negative thresholds, which results in a configuration of thresholds in which the absolute value of a threshold in erased state is large and the absolute value of a threshold in programmed state is small. In the B4-Flash, a read disturb causes a threshold in programmed state to shift toward erased state.

In the conventional NAND and NOR flash, on the other hand, a read disturb causes a shift in the opposite way to the B4-Flash, i.e., causes a threshold in erased state to shift toward programmed state.

It is an object of the present invention to recover a threshold shift on a cell of the B4-Flash whose threshold has shifted due to a read disturb.

SUMMARY OF THE INVENTION

The following is a brief summary of representative examples of the invention that is disclosed in the present application.

The present invention provides a nonvolatile semiconductor memory device including: a P-type memory cell transistor having a source, a drain, a gate, and a charge storage layer; and a control circuit which, in a case where the P-type memory cell transistor has its threshold greater than or equal to a first value and less than or equal to a second value, carries out a program operation of injecting electrons into the charge storage layer.

The present invention provides a nonvolatile semiconductor memory device including: a P-type memory cell transistor having a source, a drain, a gate, and a charge storage layer; a first latch circuit for controlling a voltage that is supplied to the drain during a program operation; a second latch circuit that holds data read out from the P-type memory cell transistor; and a control circuit which executes a read disturb determination sequence of exercising control so as to latch, in the second circuit, first data read out by applying a first voltage to the gate of the P-type memory cell transistor, generate recovery data by taking logic of the first data and second data read out by applying a second voltage to the gate of the P-type memory cell transistor, and latch the recovery data in the first latch circuit.

It is desirable that only in a case where the recovery data is held in the first latch circuit, the control circuit execute a program sequence of injecting electrons into the charge storage layer of the P-type memory cell transistor.

It is desirable that the program sequence repeat a cycle of verify reading of determining whether or not the threshold of the P-type memory cell transistor exceeds a predetermined verify potential and a program operation of performing programming on the P-type memory cell transistor only in a case where the threshold of the P-type memory cell transistor does not exceed the predetermined verify potential.

It is desirable that the control circuit start the determination sequence by receiving a command from an outside source.

It is desirable that the control circuit sequentially repeat the determination sequence and the program sequence on the P-type memory cell transistor whose address is in a predetermined scope.

It is desirable that the first latch circuit and the second latch circuit each hold program data, and the P-type memory cell transistor hold data with a threshold distribution of four or more values.

Advantageous Effects of the Invention

The present invention makes it possible to recover a threshold shift on a cell of the B4-Flash whose threshold has shifted due to a read disturb.

BRIEF DESCRIPTION OF DRAWINGS

FIG. 2 is a table showing a relationship among voltages that are applied to nodes during program operation, erase operation, and read operation in the B4-Flash memory.

FIG. 6 is a logic diagram of a logic circuit (LC).

DESCRIPTION OF EMBODIMENTS

First, the structure and operation of a B4-Flash are described.

Figure 1:
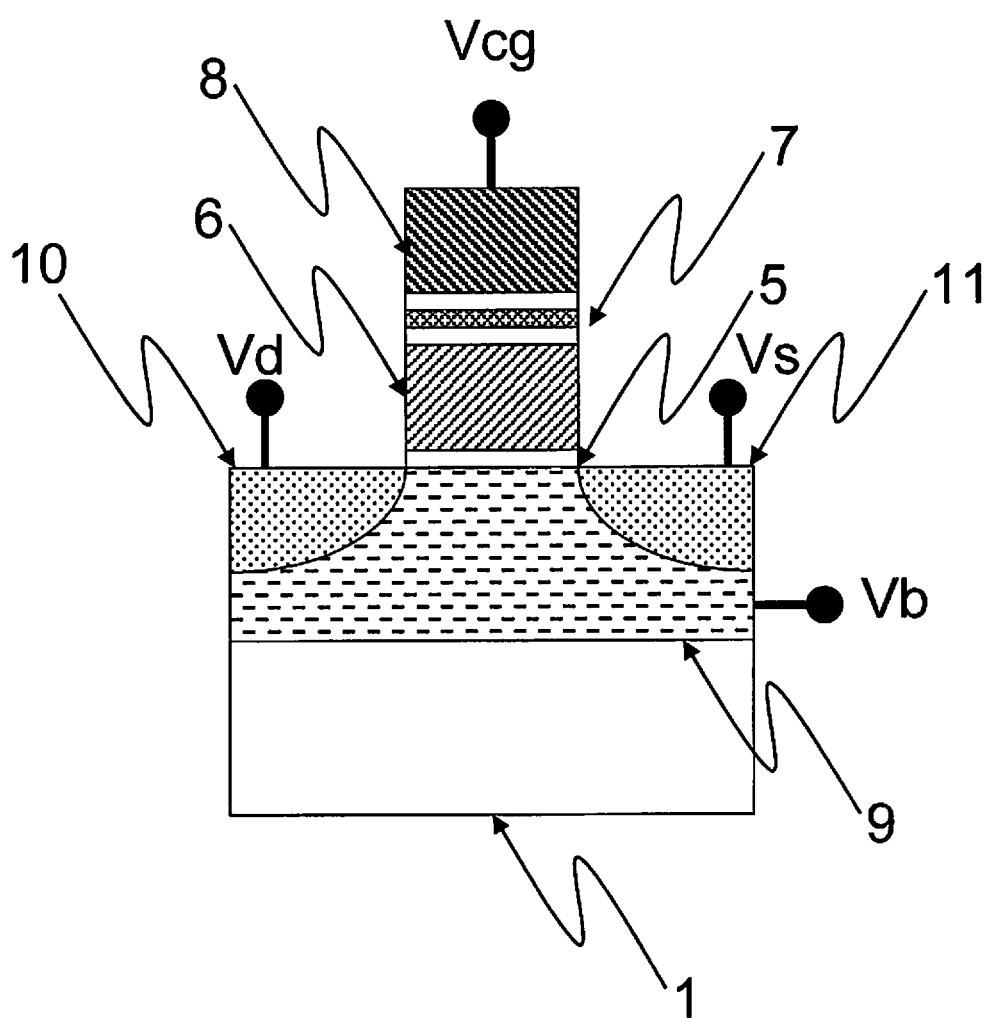
FIG. 1 is a cross-sectional view of a structure of a P-type memory cell transistor that is used in a B4-Flash memory.

FIG. 1 is a cross-sectional view of a structure of a P-type memory cell transistor that is used in a B4-Flash memory. The P-type memory cell transistor is provided in an N-type well 9 formed on a P-type silicon substrate 1. Provided above a space (N-type channel region) between a P-type drain 10 and a P-type source 11 that are formed at a distance from each other are a tunnel oxide film 5, a floating gate 6 made of polysilicon and serving as a charge storage layer, an ONO insulating film 7, and a control gate 8. A source voltage Vs is applied to the source 11. A drain voltage Vd is applied to the drain 10. A back gate voltage Vb is applied to the N-type well 9. A control gate voltage Vcg is applied to the control gate 8. It should be noted that the charge storage layer is not limited to a floating gate, provided that it is a layer that stores and holds charge.

FIG. 2 is a table showing a relationship among voltages that are applied to nodes during program operation, erase operation, and read operation in the B4-Flash memory.

The program operation is carried out by generating B4 hot electrons through application of 0 V (voltage that is lower than the power supply voltage) as Vd, 10 V (high voltage) as Vcg, 1.8 V (power supply voltage or a voltage obtained by slightly boosting the power supply voltage) as Vs, and 5 V (boosted voltage) as Vb (Patent Document 4) and injecting the B4 hot electrons into the floating gate 6.

The erase operation is carried out by generating a FN tunnel current through application of 10 V (high voltage) as Vd, Vs, and Vd and −10 V (negative voltage) as Vcg and pulling out the electrons from the floating gate 6 into the N-type well 9.

The read operation is carried out by detecting, through application of 0.8 V as Vd, 1.8 V as Vs and Vb, and (reference voltage that is lower than the power supply voltage) as Vr, whether an electric current flows between the source and drain of the P-type memory cell transistor.

A distribution of thresholds of the B4-Flash is described with reference to FIG. 3. The vertical axis N represents the number of memory cells, and the horizontal axis represents the threshold Vth. The memory cells used are P-type MOS transistors, and therefore have negative thresholds, with the result that the absolute value of a threshold (which corresponds to the distribution 31) in erased state (Erased, which corresponds to "1" data) is large and the absolute value of a threshold (which corresponds to the distribution 32) in programmed state (Programmed, which corresponds to "0" data) is small.

During read operation (read), a predetermined read voltage Vr (which is negative in potential as compared with the power supply voltage of 1.8 V that is applied to the source during reading, but can be higher or lower than the ground voltage of 0 V) is supplied to a word line WL connected to the control gate. This voltage is a voltage that lies between the threshold distribution 31 in erased state and the threshold distribution 32 in programmed state.

In a program sequence, a cycle of program verify and program operation is repeated. The program verify is a kind of read operation by which reading is carried out by applying a predetermined program verify voltage Vpv to the word line WL connected to the control gate. Then, program operation is performed only on a cell in which the readout result has not been sufficiently programmed.

Figure 3:
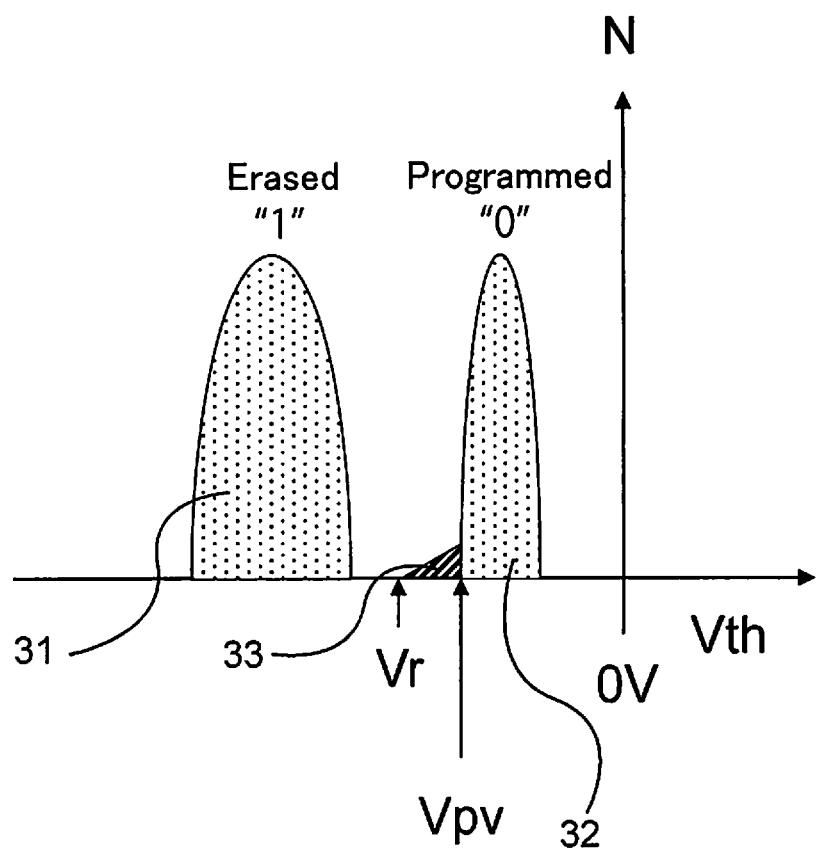
FIG. 3 is a graph showing a distribution of thresholds after the occurrence of a read disturb in the B4-Flash memory.

FIG. 3 also refers to read disturbs. Since the B4-Flash uses P-type MOS transistors as its memory cells, the potential that is applied to the control gate 8 during reading is negative. For this reason, a read disturb causes electrons to flow out from the floating gate 6 into the N-type well 9 in some bits that are inferior in insulating properties of the tunnel oxide film 5. Therefore, in the B4-Flash, a read disturb causes a threshold in programmed state to shift (which corresponds to the distribution 33 in the shift portion) toward erased state. Thus, in the B4-Flash, a read disturb causes a shift in the opposite way to the conventional NAND and NOR flash memories, in which a read disturb causes a threshold in erased state to shift toward programmed state.

All these features make it possible to recover a shift in threshold due to a read disturb by performing program operation on a cell of the B4-Flash whose threshold has shifted due to a read disturb.

Figure 4:
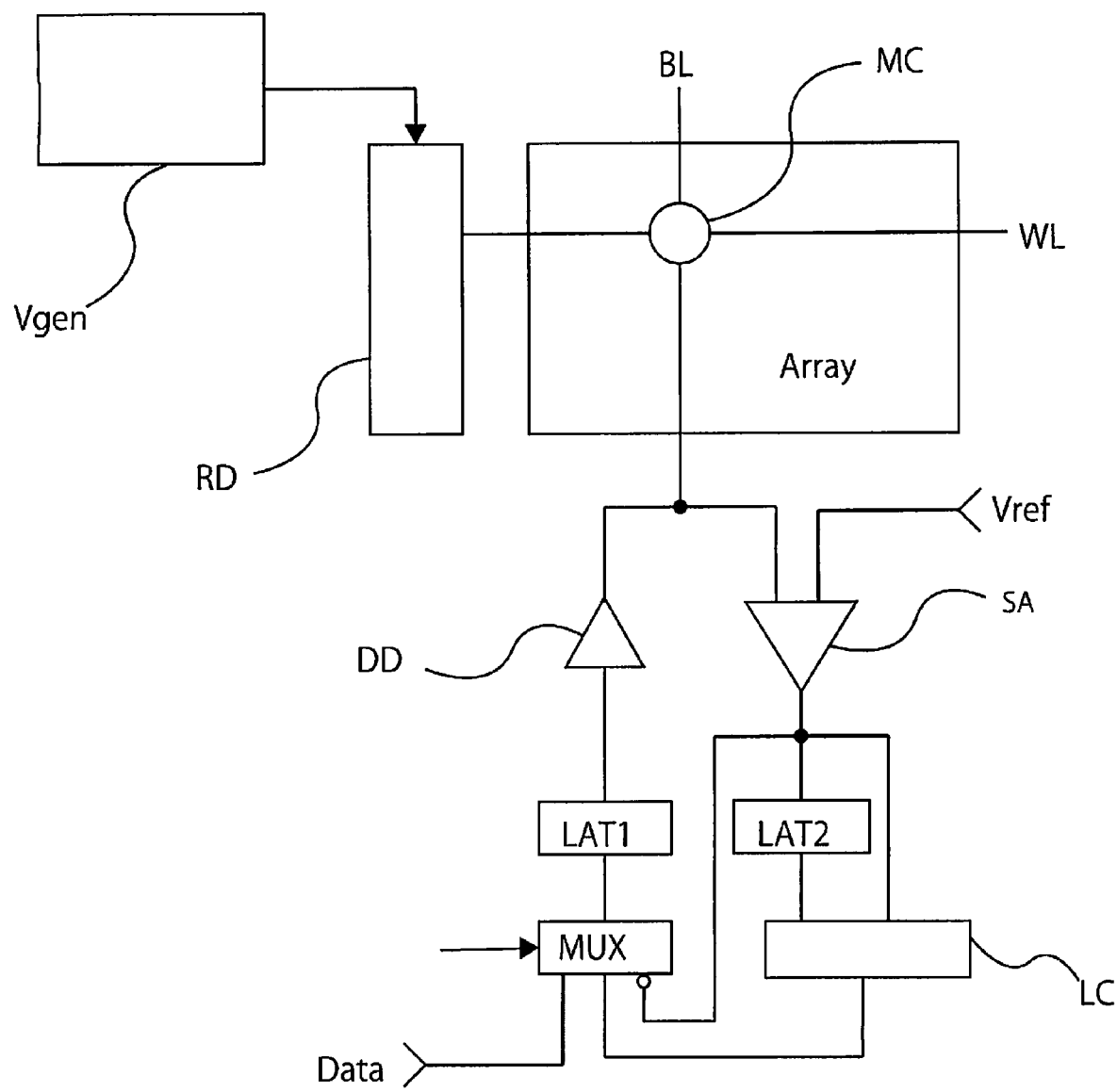
FIG. 4 is a circuitry diagram of a first embodiment (SLC) of the present invention.

FIG. 4 is a circuitry diagram of a first embodiment (SLC) of the present invention. In a memory cell array Array having an arrangement of the aforementioned P-type memory cell transistors MC in rows and columns, the control gates of those memory transistors MC which belong to the same row is connected to the word line WL of the same row, and the drains of those memory transistors MC which belong to the same column is directly or indirectly connected to the bit line BL of the same column.

A row decoder-driver circuit RD selects a word line WL and drives it at one of a plurality of voltages (whose relationship is shown in the table of FIG. 2). A voltage generation circuit Vgen is a circuit that supplies voltages such as Vr, Vrd, and Vpv (Vr<Vrd<Vpv<1.8 V) according to each mode of operation. A latch circuit LAT1 controls the voltage Vd that is supplied to the drain (connected to BL) during program operation. A latch circuit LAT2 holds data read out from a memory cell transistor MC.

A data driver DD generates the voltage Vd that is supplied to the drain (connected to BL) during program operation. A sense amplifier SA is for example a current-mirror comparison circuit, and supplies the latch circuit LAT2 with a result of comparison between a bit line voltage and a reference voltage Vref (data read out from the memory cell transistor MC). A logic circuit LC is a circuit that carries out read disturb determination, and takes the logic of the output from the latch circuit LAT2 and the output from the sense amplifier SA and outputs the resulting logic. A multiplexer MUX is a circuit that selects program data Data that is inputted from an outside source, the output from the sense amplifier SA, or the output from the logic circuit LC and supplies it to the latch circuit LAT1.

Figure 6:
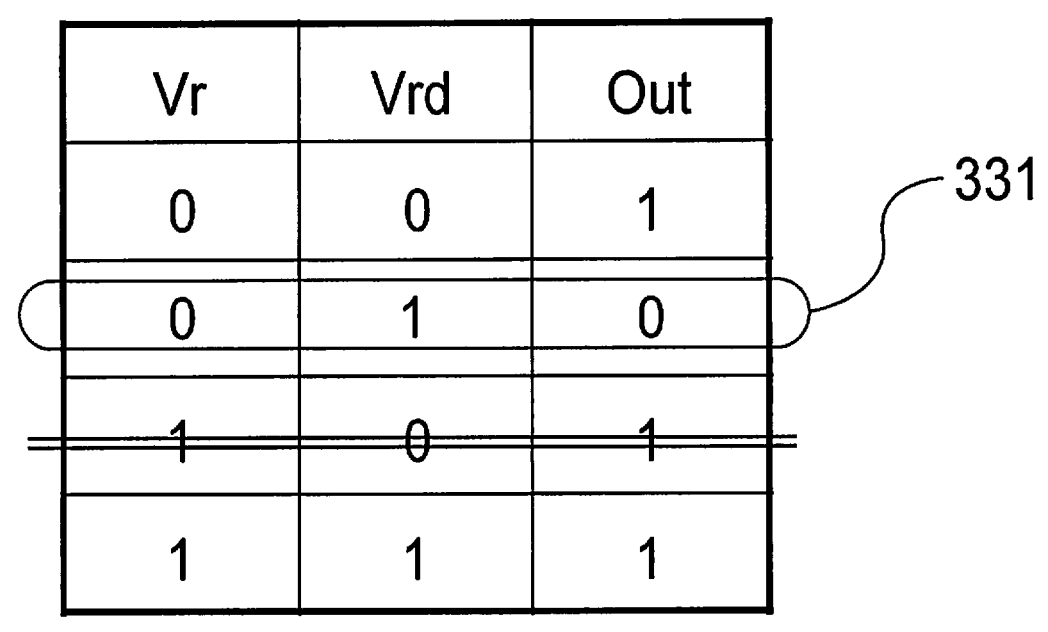
Figure 7:
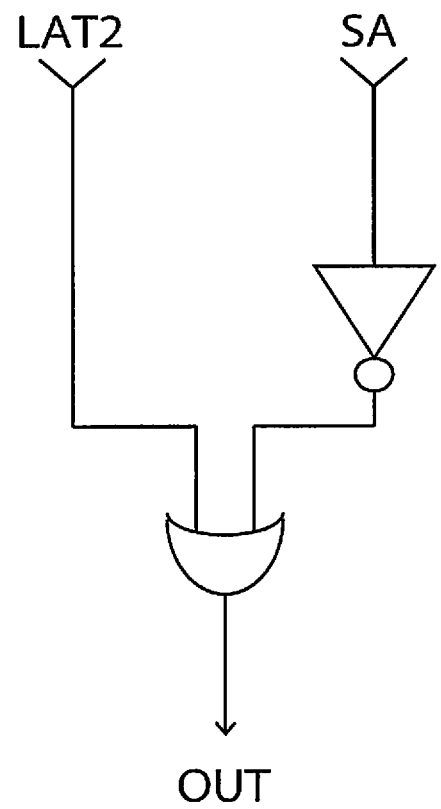
FIG. 7 is a circuit diagram of the logic circuit (LC).

FIG. 6 shows a logic diagram of the logic circuit (LC), and FIG. 7 shows an example of the circuit.

Figure 5:
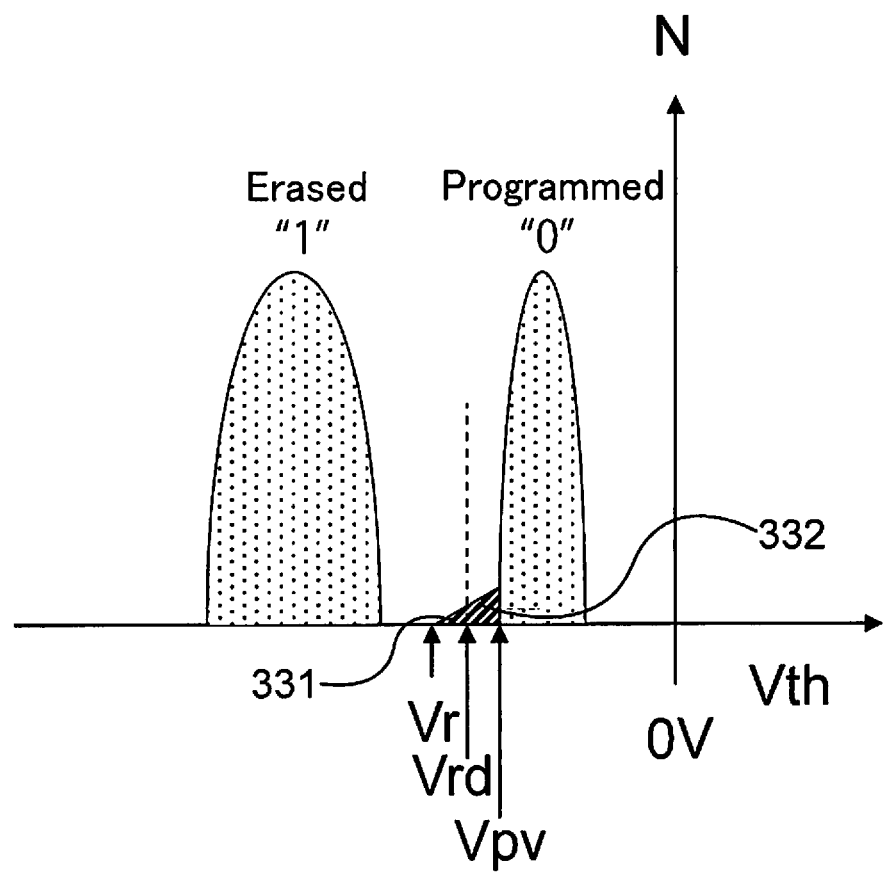
FIG. 5 is a graph showing a method of read disturb determination in the B4-Flash memory.

FIG. 5 is a graph showing a method of read disturb determination in the B4-Flash memory. Read disturb determination is carried out in order to specify, among the shifts 32 in threshold due to read disturbs, a cell that needs recovery. The method of determination is accomplished by specifying a memory cell whose threshold is larger than the reference voltage Vr and smaller than Vrd. It is desirable that Vr<Vrd<Vpv<1.8 V. However, it may be that Vrd=Vpv (reference voltage at which program verify is carried out). Among the memory cells in which threshold shifts have occurred due to read disturbs, those memory cells (distribution 331) whose thresholds are lower than Vrd are subjected to read disturb recovery, and those memory cells (distribution 332) whose thresholds are higher than Vrd are not subjected to read disturb recovery.

Steps of read disturb recovery are described below with reference to FIG. 8. In read disturb recovery mode, normal reading is done first (Vr is supplied to the word line WL), and then the readout result is latched in the latch circuit LAT2 (step 81). In this step, "1" is latched in the latch circuit LAT2 in the case of cells whose thresholds fall within the distribution 31 (cells in erased state), and "0" is latched in the latch circuit LAT2 in the case of cell whose thresholds fall within a distribution other than the distribution 31 (cells in programmed state, including cells in which threshold shifts have occurred due to disturbs). This operation is intended not to perform read disturb operation on a cell in erased state.

Next, read disturb determination reading is done (Vrd is supplied to the word line WL). The logic of the readout result and the output from the latch circuit LAT2 is taken by the logic circuit LC. The resulting logic is latched in the latch circuit LAT1 through the multiplexer MUX (step 82). In this step, those cells whose thresholds fall within the distribution 331 (i.e., cells to be subjected to read disturb recovery) show "1" as the output from the sense amplifier SA, and those cells whose thresholds fall within the distribution 332 and those cells in the distribution 32 in which no read disturbs have occurred show "0" as the output from the sense amplifier SA.

According to the logic diagram of FIG. 6, in a case where a combination of the output (example of Vr) from the latch circuit LAT2 during normal reading and the output (example of Vrd) from the sense amplifier SA during read disturb determination reading is "0" and "1", the output from the logic circuit LC is "0", which is latched in the latch circuit LAT1. When "0" is latched in the latch circuit LAT1 in the step that follows, program operation is carried out by the data driver DD supplying 0 V to the bit line BL. When "1" is latched in the latch circuit LAT1 in the step that follows, program operation is inhibited by the data driver DD supplying 1.8 V to the bit line BL (program inhibit).

Next, program operation is performed on a memory cell that has passed the read disturb determination. This is accomplished by executing a program sequence (step 83) that is executed during normal programming. In the program sequence, a cycle of program verify (step 84) and program operation (step 85) is repeated.

As mentioned above, the program verify (step 84) is a kind of read operation by which reading is carried out by applying a predetermined program verify voltage Vpv to the word line WL connected to the control gate. In this step, a cell that needs additional programming shows "1" as the output from the sense amplifier SA, and a cell that does not need additional programming shows "0" as the output from the sense amplifier SA. Moreover, since the sense amplifier SA has its output terminal connected to the inverting input terminal of the multiplexer MUX, "0" is latched in the latch circuit LAT1 in the case of a cell that needs additional programming, and "1" is latched in the latch circuit LAT1 in the case of a cell that does not need additional programming. In this way, control is exercised so that additional programming is performed only on those cells which need additional programming.

In the program operation (step 85), the threshold voltage of a memory cell to be subjected to programming is boosted by applying a program voltage Vpg (10 V) to the word line WL.

Figure 8:
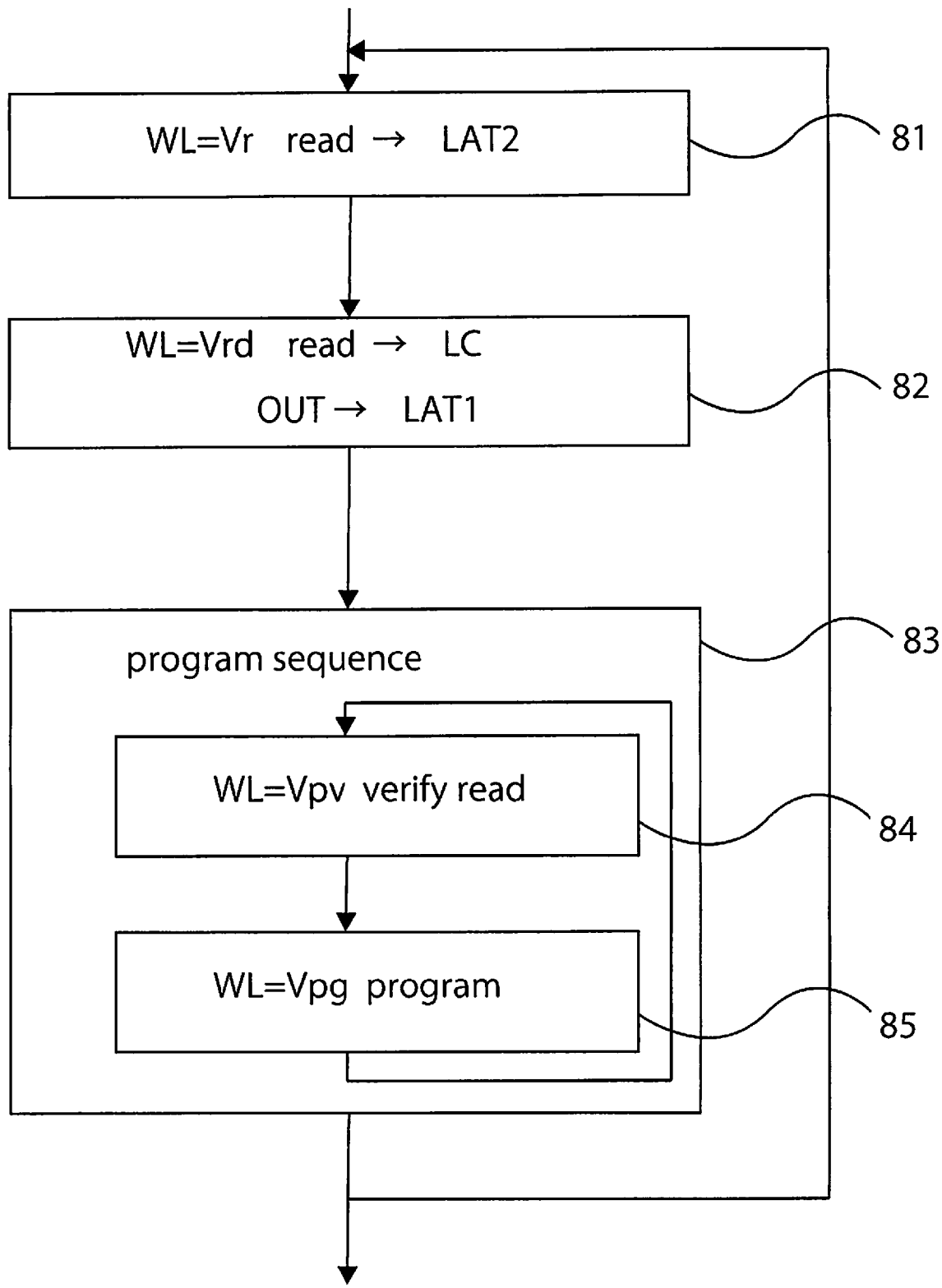
FIG. 8 is a flow chart showing steps of read disturb recovery.

The series of steps of read disturb recovery shown in FIG. 8 is repeated with addresses incremented in sequence.

Figure 9:
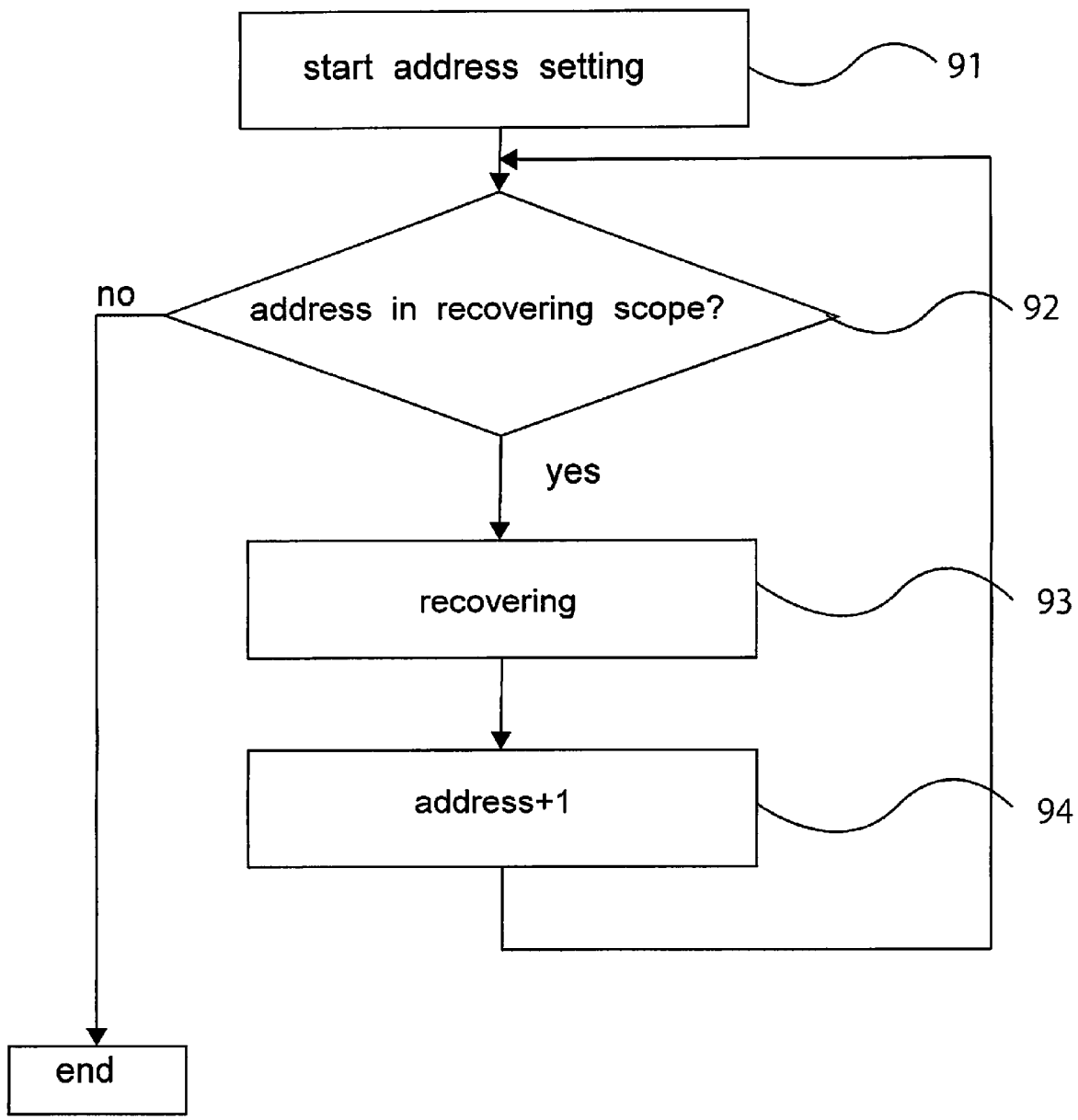
FIG. 9 is a flow chart showing a read disturb recovery sequence.

FIG. 9 shows a read disturb recovery sequence. First, the start address of a scope of addresses on which the read disturb recovery operation is performed is set in an address register (not illustrated) (step 91). Next, a determination is made as to whether the start address is in a scope of addresses on which the read disturb recovery operation is performed (step 92). This is accomplished by holding, in a separate register (not illustrated), the final address of the scope of addresses on which the read disturb recovery operation is performed and comparing the size of the final address with the size of the address set in the address register. Then, if the start address is not in a scope of addresses on which the read disturb recovery operation is performed, the sequence ends (end). Alternatively, if the start address is in a scope of addresses on which the read disturb recovery operation is performed, the sequence proceeds to the read disturb recovery operation (recovering, step 93).

The read disturb recovery operation is a series of steps 81 to 85 shown in FIG. 8. Then, 1 is added to the address set in the address register (step 94), and the sequence repeats itself by returning to step 92.

Figure 10:
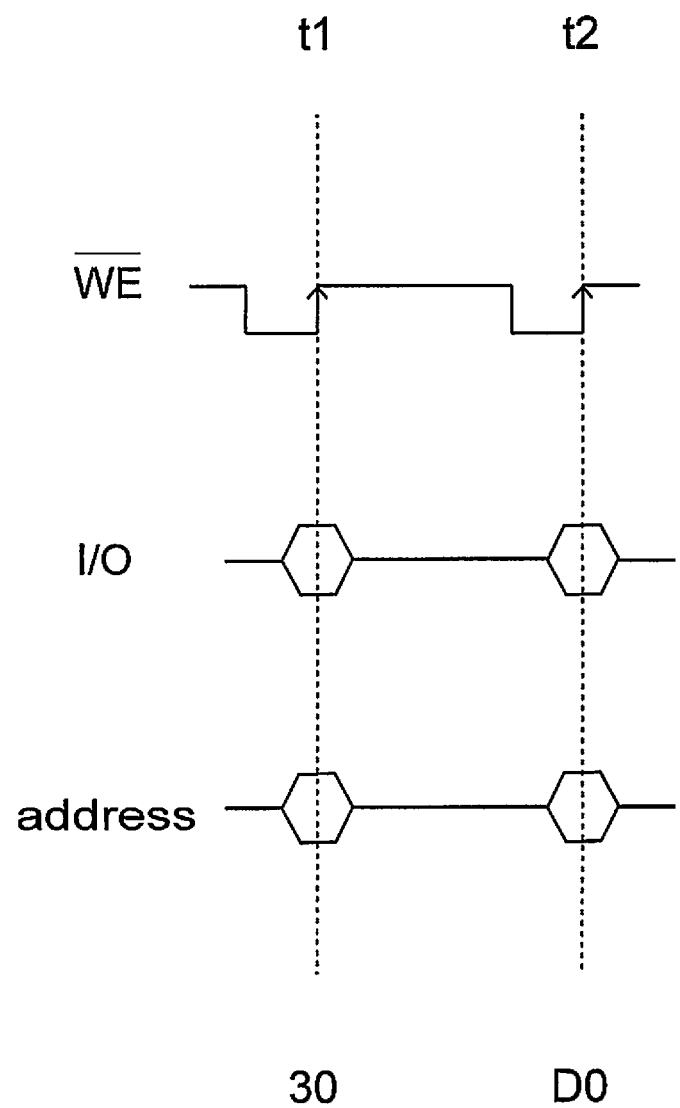
FIG. 10 is a timing chart showing timing to load a read disturb recovery command.
Figure 11:
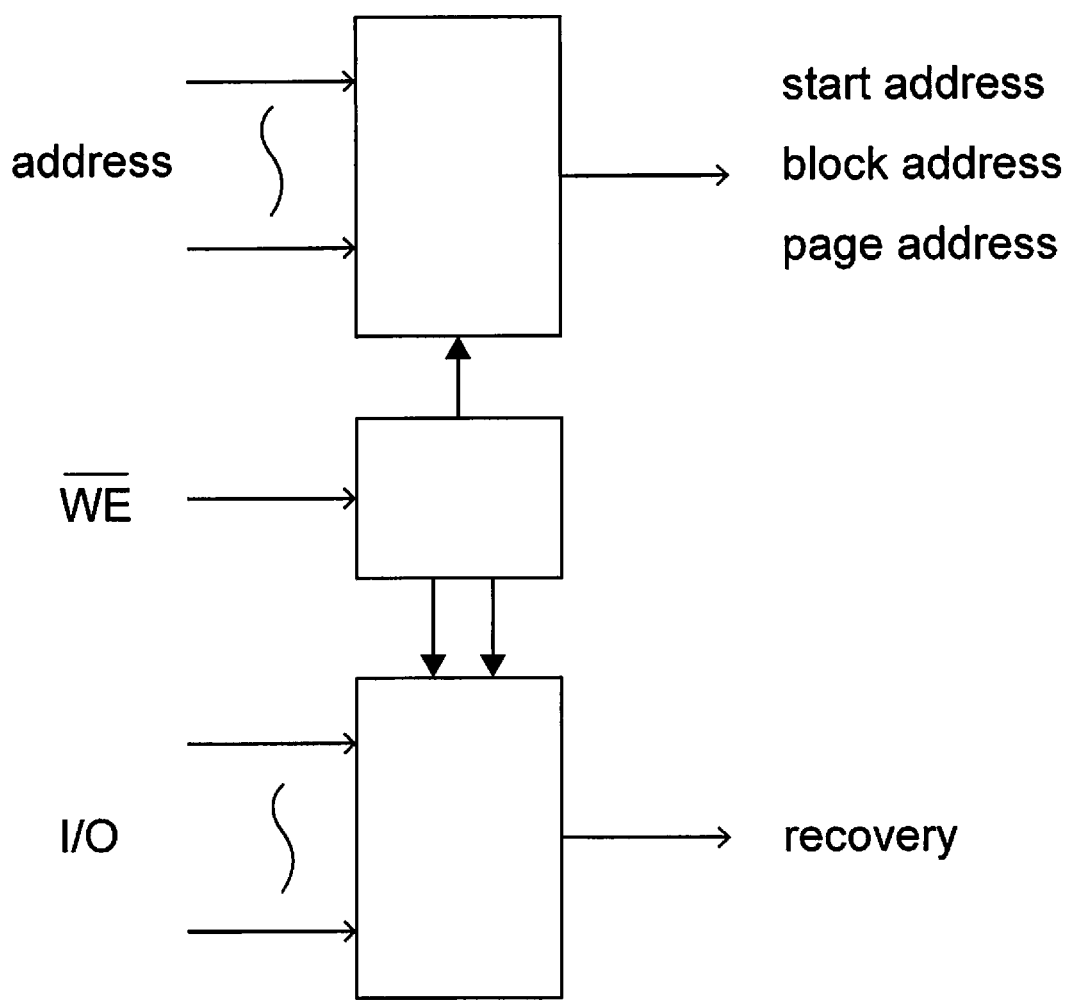
FIG. 11 is a block diagram of a control circuit that loads a read disturb recovery command, a start address, etc.

While there can be various ways of entering read disturb recovery mode, the number of times reading happens is appropriately managed by managing it outside of a flash memory chip. Accordingly, an external command for making entry into read disturb recovery mode is used. FIG. 10 shows a timing chart showing timing to load a read disturb recovery command, and FIG. 11 shows a block diagram of a control circuit that loads a read disturb recovery command, a start address, etc.

In the example shown in FIG. 10, entry into read disturb recovery mode is made by loading "30" and "D0" in twice through a data I/O pin at rising edges of a clock signal that is supplied to a/WE pin. At the same time, by supplying an address to an address pin, various addresses of a cell to be subjected to read disturb recovery, such as the start or final address, the block address (upper address indicative of a block of erase units), and the page address (address indicative of a block of program units), may be loaded. In a case where the start and final addresses are loaded, they are loaded in twice through the address pin.

By thus designating an appropriate timing from an outside source, entry into read disturb recovery mode can be made. The timing can for example be the timing of power-up or the timing of power-down in the case of use in a portable electronic device.

Figure 12:
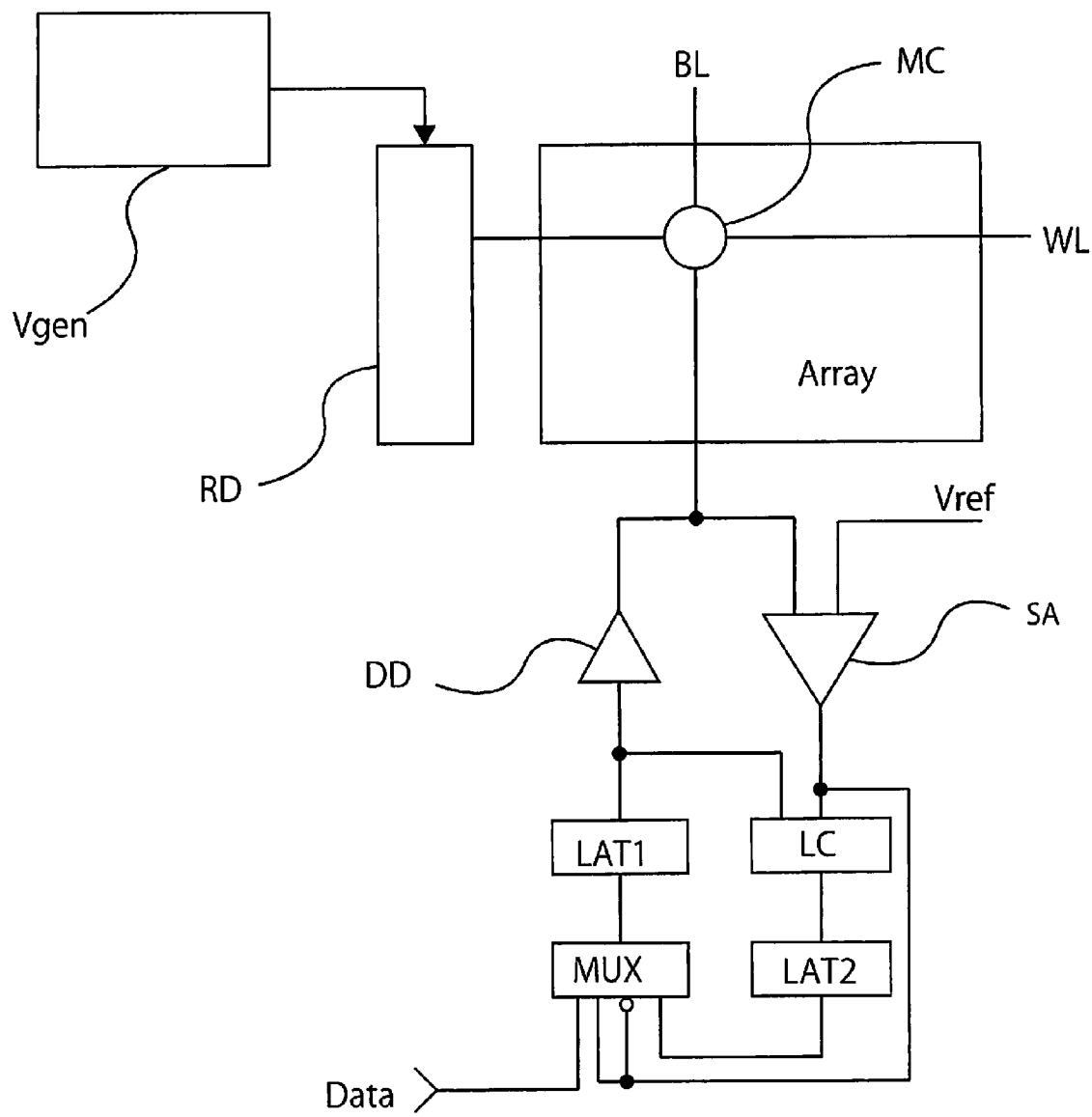
FIG. 12 is a circuitry diagram of a second embodiment of the present invention.

FIG. 12 shows a circuitry diagram of a second embodiment of the present invention. The memory cell array Array, the row decoder/driver circuit RD, the voltage generation circuit Vgen, the latch circuit LAT1, the data driver DD, the sense amplifier SA are the same as those of the circuitry of the first embodiment.

The logic circuit LC is a circuit that carries out read disturb determination, and takes the logic of the output from the latch circuit LAT1 and the output from the sense amplifier SA and outputs the resulting logic. The latch circuit LAT2 holds the output from the logic circuit LC. The multiplexer MUX selects program data Data that is inputted from an outside source, the output from the sense amplifier SA or an inversion thereof, or the output from the latch circuit LAT2 and supplies it to the latch circuit LAT1.

Figure 13:
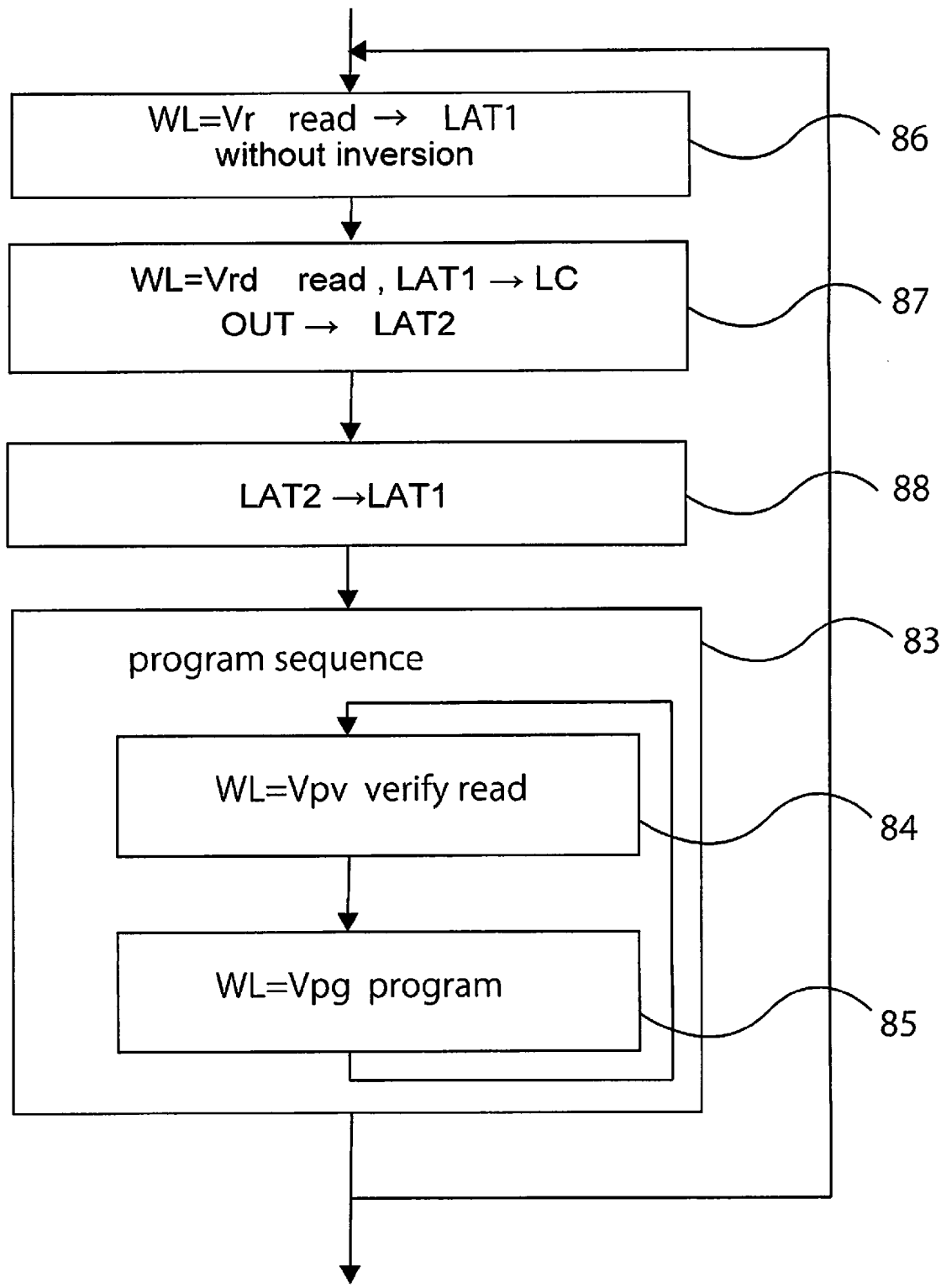
FIG. 13 is a flow chart showing steps of read disturb recovery in the second embodiment of the present invention.

FIG. 13 shows steps of read disturb recovery in the second embodiment of the present invention. Upon entry into read disturb recovery mode, normal reading is done first (Vr is supplied to the word line WL), and then the readout result is latched in the latch circuit LAT1 through the multiplexer MUX (step 86). In this step, "1" is latched in the latch circuit LAT1 in the case of cells whose thresholds fall within the distribution 31 (cells in erased state), and "0" is latched in the latch circuit LAT1 in the case of cells whose thresholds fall within a distribution other than the distribution 31 (cells in programmed state, including cells in which threshold shifts have occurred due to disturbs). This operation is intended not to perform read disturb operation on a cell in erased state.

Next, read disturb determination reading is done (Vrd is supplied to the word line WL). The logic of the readout result and the output from the latch circuit LAT1 is taken by the logic circuit LC. The resulting logic is latched in the latch circuit LAT2 (step 87). In this step, "0" is latched in the latch circuit LAT2 in the case of cells whose thresholds fall within the distribution 331 (i.e., cells to be subjected to read disturb recovery), and "1" is latched in the latch circuit LAT2 in the case of cells whose thresholds fall within the distribution 332 and cells in the distribution 32 in which no read disturbs have occurred.

Next, data from the latch circuit LAT2 is transferred to the latch circuit LAT1 through the multiplexer MUX (step 88).

As for the execution of a program sequence (step 83) on a memory cell that has passed read disturb determination, the same applies to the first embodiment. The series of steps of read disturb recovery shown in FIG. 13 is repeated with addresses incremented in sequence. As for the content of explanations in FIGS. 9 through 11, the same applies to the second embodiment.

Figure 14:
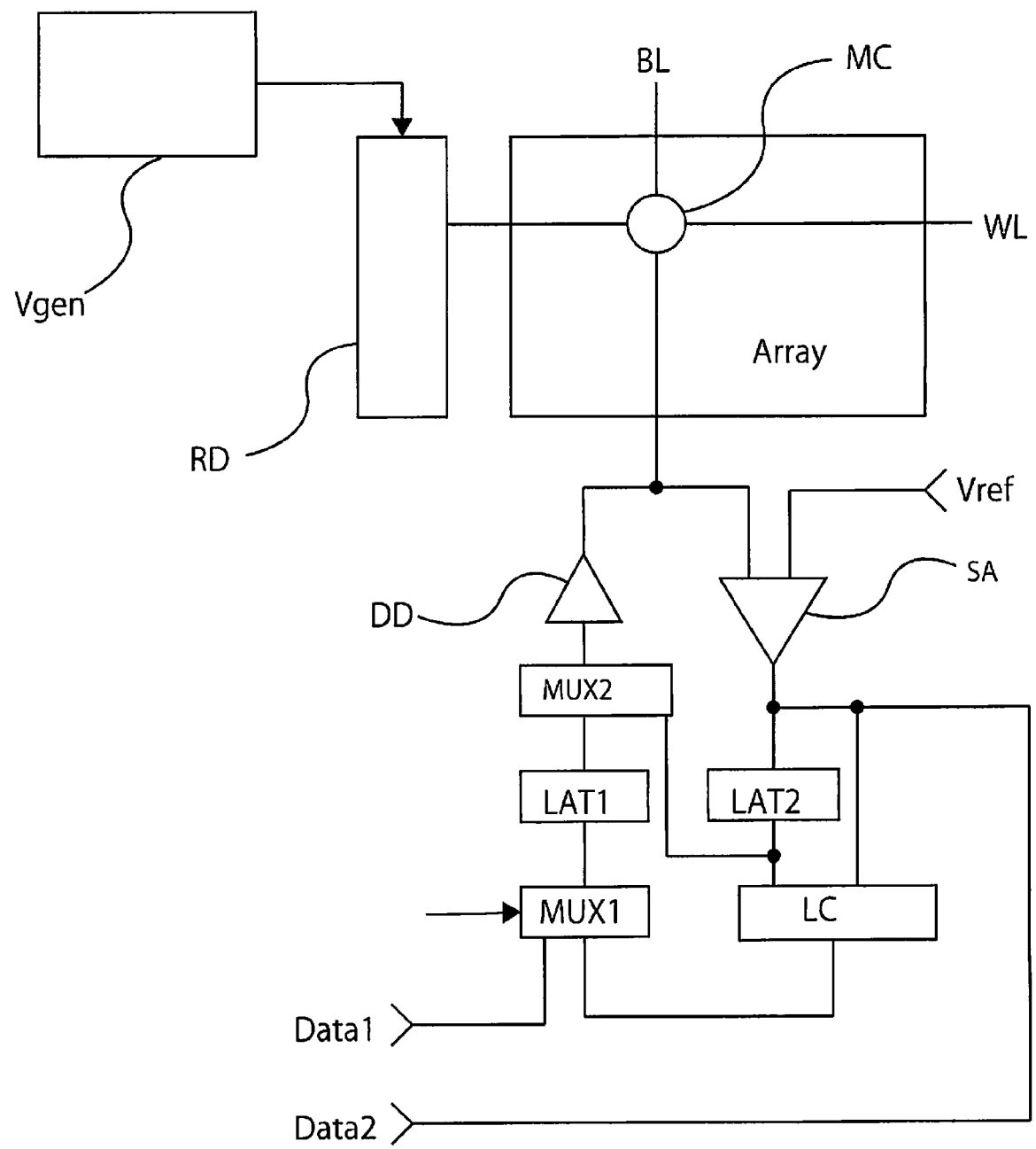
FIG. 14 is a circuitry diagram of the third embodiment (MLC) of the present invention.

FIG. 14 is a circuitry diagram of a third embodiment of the present invention. This is an example of a multivalued memory MLC in which 2-bit data (with four ranges of thresholds) is programmed in each memory cell. In a memory cell array Array having an arrangement of the aforementioned P-type memory cell transistors MC in rows and columns, the control gates of those memory transistors MC which belong to the same row is connected to the word line WL of the same row, and the control gates of those memory transistors MC which belong to the same column is directly or indirectly connected to the bit line BL of the same column.

A row decoder-driver circuit RD selects a word line WL and drives it at one of a plurality of voltages (whose relationship is shown in the table of FIG. 2). A voltage generation circuit Vgen is a circuit that supplies voltages such as Vr(11), Vrd(11), Vpv(11), Vr(10), Vrd(10), Vpv(10), Vr(01), Vrd (01), and Vpv(01) (Vr(11)<Vrd(11)<Vpv(11)<1.8 V, Vr(10) <Vrd(10)<Vpv(10)<1.8 V, Vr(01)<Vrd(01)<Vpv(01)<1.8 V) according to each mode of operation.

A latch circuit LAT1 holds part of program data and controls the voltage Vd that is supplied to the drain (connected to BL) during program operation. A latch circuit LAT2 holds another part of the program data and holds data read out from a memory cell transistor MC. A data driver DD generates the voltage Vd that is supplied to the drain (connected to BL) during program operation. A sense amplifier SA is for example a current-mirror comparison circuit, and supplies the latch circuit LAT2 with a result of comparison between a bit line voltage and a reference voltage Vref (data read out from the memory cell transistor MC). A logic circuit LC is a circuit that carries out read disturb determination, and takes the logic of the output from the latch circuit LAT2 and the output from the sense amplifier SA and outputs the resulting logic. A multiplexer MUX1 is a circuit that selects program data Data inputted from an outside source or the output from the logic circuit LC and supplies it to the latch circuit LAT1. The multiplexer MUX2 is a circuit that selects the output from the latch circuit LAT1 or the output from the latch circuit LAT2 and supplies it to the data driver DD. A path for program verify is omitted.

With this configuration, it becomes possible to commonly use the same latch circuit both as the latch circuits LAT1 and LAT2, in which multivalued program data is held, and as a latch circuit necessary for holding readout data temporarily for read disturb determination and performing logical operation. This contributes to a reduction in chip area.

Figure 15:
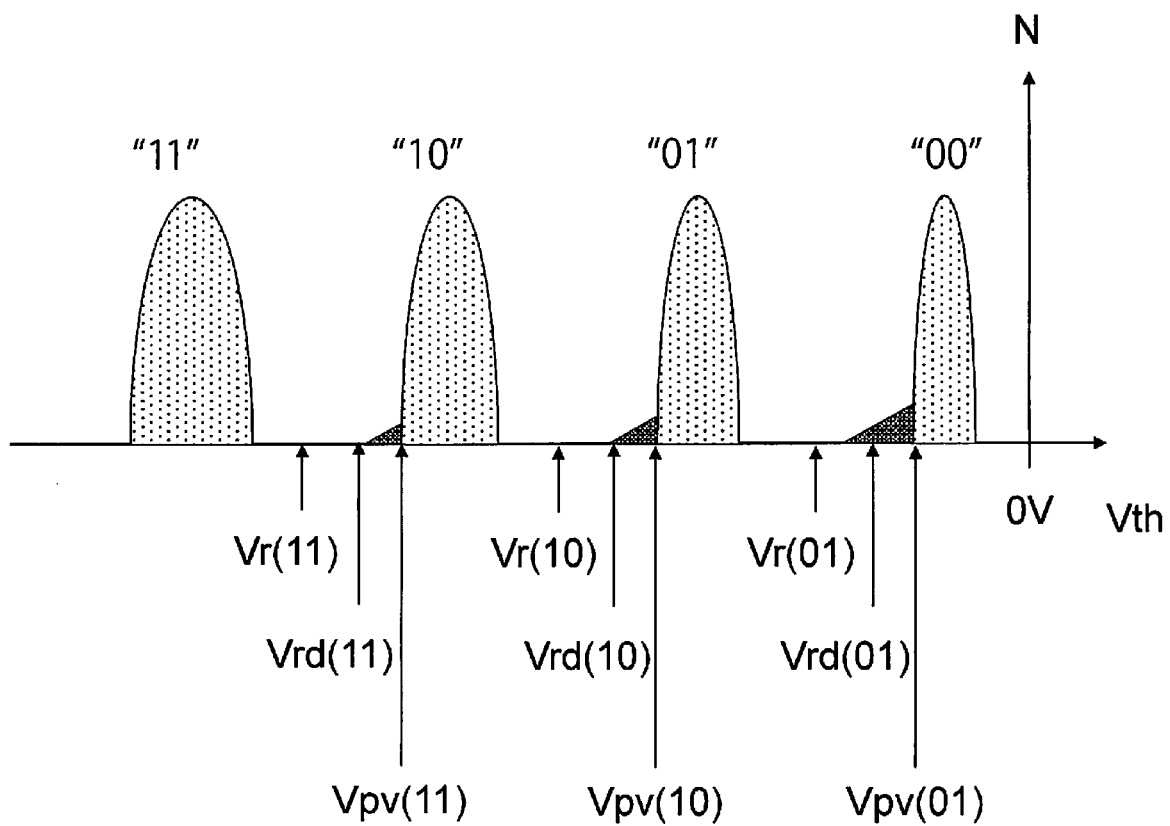
FIG. 15 is a graph showing a method of read disturb determination in the third embodiment of the present invention.

FIG. 15 shows a method of read disturb determination in a multivalued B4-Flash memory. In the multivalued B4-Flash memory, a shift in threshold due to a read disturb occurs in each of the threshold distributions "10", "01", and "00". Read disturb determination in the multivalued B4-Flash memory is carried out by individually specifying a cell having a threshold Vth in the range of Vr(11)<Vth<Vrd(11), a cell having a threshold Vth in the range of Vr(10)<Vth<Vrd(10), and a cell having a threshold Vth in the range of Vr(01)<Vth<Vrd(01).

It should be noted that since the occurrence of a read disturb is remarkable in a programmed state in which the absolute value of a threshold is small, i.e., in "01" and "00", but is not remarkable in "10", read disturb determination and read disturb recovery operation may be carried out only in "01" and "00" or only in "00". This makes it possible to reduce the amount of time required for read disturb recovery.

What is claimed is:

1. A nonvolatile semiconductor memory device, comprising:
    a P-type memory cell transistor having a source, a drain, a gate, and a charge storage layer;
    a first latch circuit for controlling a voltage that is supplied to the drain during a program operation;
    a second latch circuit that holds data read out from the P-type memory cell transistor; and
    a control circuit which executes a read disturb determination sequence of exercising control so as to latch, in the second latch circuit, first data read out by applying a first voltage to the gate of the P-type memory cell transistor, generate recovery data by taking logic of the first data and second data read out by applying a second voltage to the gate of the P-type memory cell transistor, and latch the recovery data in the first latch circuit.

2. The nonvolatile semiconductor memory device as set forth in claim 1, wherein only in a case where the recovery data is held in the first latch circuit, the control circuit executes a program sequence of injecting electrons into the charge storage layer of the P-type memory cell transistor.

3. The nonvolatile semiconductor memory device as set forth in claim 2, wherein the program sequence repeats a cycle of verify reading of determining whether or not the threshold of the P-type memory cell transistor exceeds a predetermined verify potential and a program operation of performing programming on the P-type memory cell transistor only in a case where the threshold of the P-type memory cell transistor does not exceed the predetermined verify potential.

4. The nonvolatile semiconductor memory device as set forth in claim 2, wherein the control circuit starts the determination sequence by receiving a command from an outside source.

5. The nonvolatile semiconductor memory device as set forth in claim 2, wherein the control circuit sequentially repeats the determination sequence and the program sequence on the P-type memory cell transistor whose address is in a predetermined scope.

6. The nonvolatile semiconductor memory device as set forth in claim 1, wherein the first latch circuit and the second latch circuit each hold program data, and the P-type memory cell transistor holds data with a threshold distribution of four or more values.

* * * * *